(12) United States Patent
Smith et al.

(10) Patent No.: US 7,477,396 B2
(45) Date of Patent: Jan. 13, 2009

(54) METHODS AND SYSTEMS FOR DETERMINING OVERLAY ERROR BASED ON TARGET IMAGE SYMMETRY

(75) Inventors: Nigel Peter Smith, Hsinchu (TW); Yi-sha Ku, Hsinchu (TW); Hsiu-Lan Pang, Hsinchu (TW)

(73) Assignee: Nanometrics Incorporated, Milpitas, CA (US)

( * ) Notice: Subject to any disclaimer, the term of this patent is extended or adjusted under 35 U.S.C. 154(b) by 361 days.

(21) Appl. No.: 11/360,031

(22) Filed: Feb. 22, 2006

(65) Prior Publication Data

US 2006/0197950 A1    Sep. 7, 2006

Related U.S. Application Data

(60) Provisional application No. 60/656,662, filed on Feb. 25, 2005.

(51) Int. Cl.
G01N 21/55    (2006.01)
(52) U.S. Cl. ........................ 356/445; 356/448
(58) Field of Classification Search ................ 356/445, 356/448
See application file for complete search history.

(56) References Cited

U.S. PATENT DOCUMENTS

| | | | |
|---|---|---|---|
| 4,149,085 A | 4/1979 | Davis et al. | |
| 5,504,999 A | 4/1996 | Barr | |
| 5,958,632 A | 9/1999 | Sekiguchi | |
| 6,022,650 A | 2/2000 | Sogawa | |
| 6,077,756 A | 6/2000 | Lin et al. | |
| 6,083,807 A | 7/2000 | Hsu | |
| 6,462,818 B1 | 10/2002 | Bareket | |
| 6,486,954 B1 | 11/2002 | Mieher et al. | |
| 6,536,130 B1 | 3/2003 | Wu et al. | |
| 6,571,485 B1 | 6/2003 | Yu et al. | |
| 6,636,311 B1 | 10/2003 | Ina et al. | |
| 6,734,971 B2 | 5/2004 | Smith et al. | |
| 6,788,393 B2 * | 9/2004 | Inoue | 355/72 |
| 6,916,585 B2 | 7/2005 | Sreenivasan et al. | |
| 7,084,427 B2 | 8/2006 | Argandona et al. | |
| 7,160,657 B2 | 1/2007 | Smith et al. | |
| 2002/0063856 A1 * | 5/2002 | Inoue | 355/53 |

(Continued)

FOREIGN PATENT DOCUMENTS

JP    06-216206 A    8/1994

(Continued)

OTHER PUBLICATIONS

Response to Office Action mailed on Dec. 20, 2007 for U.S. Appl. No. 11/035,652 filed on Jan. 13, 2005 by Nigel P. Smith et al., 8 pages.

(Continued)

*Primary Examiner*—Roy M Punnoose
(74) *Attorney, Agent, or Firm*—Silicon Valley Patent Group LLP

(57) ABSTRACT

In systems and methods measure overlay error in semiconductor device manufacturing based on target image asymmetry. As a result, the advantages of using very small in-chip targets can be achieved, while their disadvantages are reduced or eliminated. Methods for determining overlay error based on measured asymmetry can be used with existing measurement tools and systems. These methods allow for improved manufacturing of semiconductor devices and similar devices formed from layers.

14 Claims, 8 Drawing Sheets

U.S. PATENT DOCUMENTS

| | | |
|---|---|---|
| 2003/0027065 A1 | 2/2003 | Fujimoto |
| 2003/0077527 A1 | 4/2003 | Ausschnitt et al. |
| 2003/0095267 A1 | 5/2003 | Mieher et al. |
| 2003/0156750 A1 | 8/2003 | Dajee et al. |
| 2004/0004726 A1 | 1/2004 | Sezginer et al. |
| 2004/0032581 A1 | 2/2004 | Nikoonahad et al. |
| 2004/0038455 A1* | 2/2004 | Seligson et al. ............ 438/122 |
| 2004/0063009 A1 | 4/2004 | Phan et al. |
| 2004/0066963 A1 | 4/2004 | Hechtl et al. |
| 2004/0126004 A1 | 7/2004 | Kikuchi |
| 2005/0195398 A1* | 9/2005 | Adel et al. ................. 356/401 |
| 2005/0208683 A1 | 9/2005 | Chen |
| 2005/0264783 A1 | 12/2005 | Smith et al. |
| 2006/0115751 A1 | 6/2006 | Fay et al. |
| 2006/0151890 A1 | 7/2006 | Smith et al. |
| 2006/0197950 A1 | 9/2006 | Smith et al. |

FOREIGN PATENT DOCUMENTS

| | | |
|---|---|---|
| WO | WO 01/29618 | 4/2001 |
| WO | WO 01/98835 | 12/2001 |
| WO | WO 01/99150 | 12/2001 |
| WO | WO 2004/049072 | 6/2004 |
| WO | WO-2006/044320 A1 | 4/2006 |
| WO | WO-2006/044320 A3 | 4/2006 |
| WO | WO-2006/093722 A2 | 9/2006 |

OTHER PUBLICATIONS

Notice of Allowance mailed on Jan. 18, 2008 for U.S. Appl. No. 11/035,652 filed Jan. 13, 2005 by Nigel P. Smith et al., 8 pages.
Attota, R. et al. "Evaluation of New In-chip and Arrayed Line Overlay Target Designs" Proc of SPIE vol. 5375:395-402; 2004; Bellingham, WA.
Caliper Tool Brochure (Aug. 11, 2004); 1 pg.
"Accent-Caliper élan" www.accentopto.com, Aug. 11, 2004; 1 pg.
United States Patent and Trademark Office, Combined Search Report and Written Opinion for PCT/US2005/36371, dated Jan. 24, 2007.
Office Action dated Dec. 18, 2006 in U.S. Appl. No. 11/035,652.
Amendment dated Mar. 19, 2007 in U.S. Appl. No. 11/035,652.
Office Action dated Jun. 1, 2007 in U.S. Appl. No. 11/035,652.
Amendment dated Aug. 20, 2007 in U.S. Appl. No. 11/035,652.
Combined International Preliminary Report on Patentability mailed on Oct. 16, 2007 & Written Opinion mailed on Sep. 24, 2007 for PCT Application No. PCT/US06/06092 filed on Feb. 22, 2006 by Accent Optical Technologies, Inc., 4 pages.
International Search Report mailed on Sep. 24, 2007 for PCT Application No. PCT/US06/06092 filed on Feb. 22, 2006 by Accent Optical Technologies, Inc., 2 pages.
Office Action mailed on Oct. 1, 2007 for U.S. Appl. No. 11/035,652 filed on Jan. 13, 2005 by Nigel P. Smith et al., 12 pages.

* cited by examiner

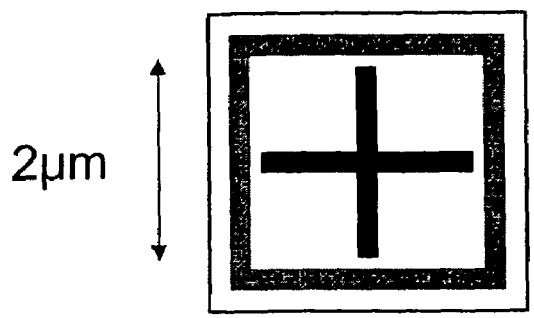
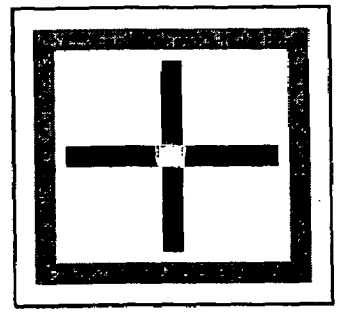
FIG. 1A    FIG. 1B
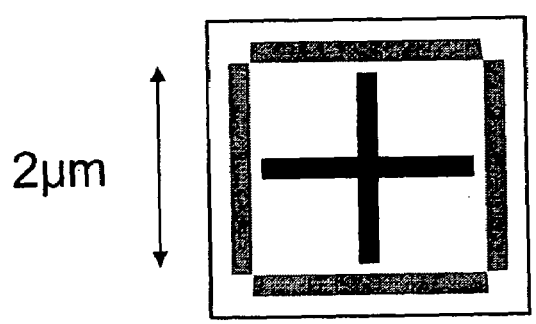
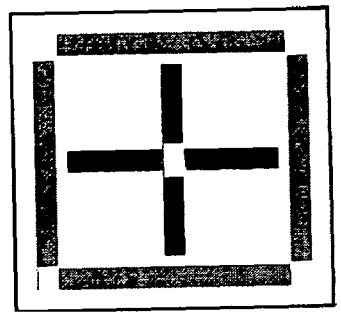
FIG. 1C    FIG. 1D
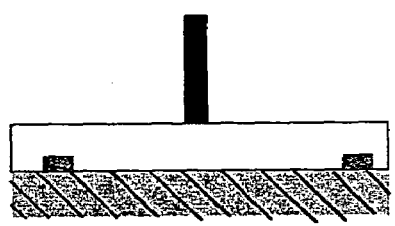
■ Resist
☐ Interlayer
▨ Pattern
▨ Substrate
FIG. 2

METHODS AND SYSTEMS FOR DETERMINING OVERLAY ERROR BASED ON TARGET IMAGE SYMMETRY

PRIORITY CLAIM

This Application claims priority to U.S. Provisional Patent Application No. 60/656,662 filed Feb. 25, 2005, and incorporated herein by reference.

BACKGROUND OF THE INVENTION

The field of the invention is overlay measurements in manufacturing of semiconductor and similar devices formed from layers.

Modern semiconductor devices, such as integrated circuits, are typically fabricated from wafers of semiconductor material. The wafers are fabricated by a succession of patterned layers of semiconductor material. Circuit patterns are fabricated using a variety of long established techniques, for example, lithographic techniques.

Overlay metrology in semiconductor device fabrication is used to determine how well one printed layer is overlaid and aligned with a previously printed layer. Close alignment of each layer at all points within the device is important for reaching the design goals. It is consequently important for the efficiency of the manufacturing process that any alignment error between two patterned layers on a wafer can be measured quickly and accurately. It is similarly important to be able to measure any alignment error between successive exposures to the same layer. Misregistration between layers is referred to as overlay error. Overlay metrology tools or machines are used to measure the overlay error. This information may be fed into a closed loop system to correct the overlay error.

Current overlay metrology uses optically readable target marks or patterns printed onto layers of a substrate, typically a semiconductor wafer, during fabrication. The relative displacement of two successive layers is measured by imaging the patterns at high magnification, digitizing the images, and processing the image data using various known image analysis algorithms to quantify the overlay error. Overlay metrology techniques thus involve the direct measurement of misregistration between patterns provided in direct association with each of the layers. As semiconductor devices become progressively smaller, making accurate overlay measurements becomes increasingly difficult. It is also important that new measurement methods and systems be able to perform at the relatively high speeds achieved with existing overlay metrology technology. Use of repeated measurements is undesirable, unless they can be made without requiring significantly more time. Consequently, developing improved metrology methods and systems raises significant technical challenges.

One technique for working with increasingly smaller microelectronic devices is use of simple targets which can be reduced in size and placed within the active area of the device. U.S. patent application Ser. No. 11/035,652, incorporated herein by reference, describes these kinds of targets.

Targets which are small enough to be placed within the active area of devices allow measurements to be made where they are actually needed. Adoption of these targets requires that they be as small as practical and, ideally, that they can be measured with existing overlay tools. There is no single correct size for these targets. However, the smaller they are, the more likely they are to be used. Targets occupying an area of approximately 1 μm square are advantageously achieved. The "size" of the target must include any blank area around it required for proper measurement.

Current optical overlay measurement systems use visible light and operate with optical resolution of approximately 0.5-1.0 μm. These systems will generally not be able to resolve the features within the proposed targets. Although these types of systems may be changed to improve optical resolution, system changes tend to be relatively time consuming, costly and with potentially uncertain results. Consequently, changing the use and operation of existing systems to provide for accurate measurements of smaller targets would be highly advantageous.

SUMMARY

With use of new breakthrough methods of operation and programming, existing systems can be made to accurately measure extremely small targets. It has surprisingly been discovered that there is a relationship between asymmetry and overlay error, and that overlay error can actually be determined or calculated based on asymmetry (or symmetry). As a result, the advantages of using very small in-chip targets can be achieved, while their disadvantages are reduced or eliminated. Methods are provided for determining overlay error based on measured asymmetry. The methods can be used with existing measurement tools and systems. The methods, and systems using the methods, allow for improved manufacturing of semiconductor devices and similar devices formed from layers.

BRIEF DESCRIPTION OF THE DRAWINGS

FIGS. 1A, 1B, 1C and 1D are plan views of an overlay target on a substrate.

FIG. 2 is section view of the targets shown in FIGS. 1A-D.

FIG. 8 also shows the weighted average of f (s, y) for all y (as the darker black line). In FIG. 8, fmin(s) is at or near zero, i.e., at the center of the target, indicating little or no offset along the X-axis.

In FIG. 9, fmin(s) occurs at about the −5 microns position, with a minimum symmetry value of about 25, indicating large overlay error.

In FIGS. 8-10, the X-axis corresponds to position of location in the region of interest, here shown as extending from about −25 nm to +25 nm. The Y-axis corresponds to calculated degree of symmetry (based on comparison of intensity values), with lower values indicating greater symmetry, and higher values indicating less symmetry.

DETAILED DESCRIPTION OF THE DRAWINGS,

A test reticle set was designed incorporating potential in-chip overlay measurement targets. Two sets of wafers were made with varying thicknesses of poly-silicon or SiO2 between the buried and surface patterns. This process created structures with the characteristic of films which prove challenging for the current generation of overlay tools: low contrast patterns buried beneath transparent or semi-transparent films of significant thickness. Test results show that it is possible to make accurate overlay measurements using such small targets. However, new image processing methods are needed to make these measurements.

Asymmetry in experimental optical intensity profiles from an in-chip overlay target has been observed. The asymmetry apparently results from proximity effects. Overlay offsets calculated from an asymmetric image, without specifically accounting for the proximity effect, will contain a measurement error in overlay. See R. Attota et al., *Evaluation of New In-Chip and Arrayed Line Overlay Target Designs*, Proceedings of the SPIE, Vol. 5375, p. 395-402, May 2004. However, as described below, overlay error can actually be determined based on measured asymmetry.

Figures 7, 8, 9:
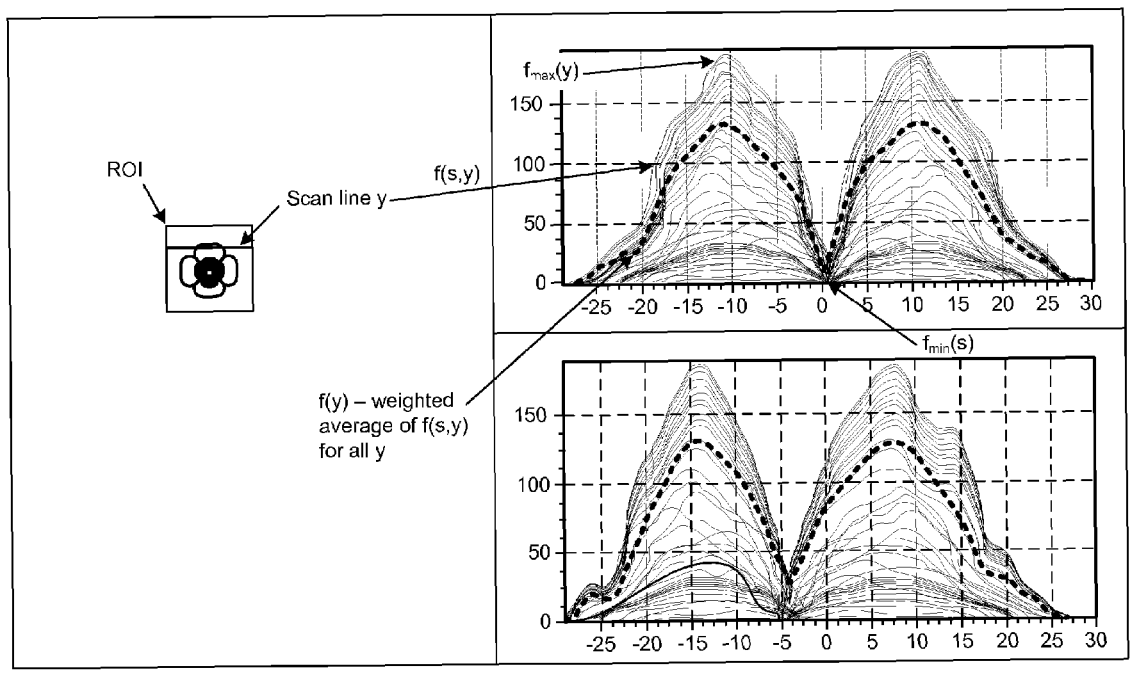
FIG. 7 is a plan view of the target of FIG. 5 within the region of interest.
FIG. 8 is a graph of the f (s, y) curves (shown in light gray lines) for the X-axis for each scan line y in FIG. 7.
FIG. 9 is a graph similar to FIG. 8 but for the Y-axis and showing the curves with a large overlay error.

One way of performing the method is:

I. Define a region of interest (ROI) that substantially completely encloses the target or pattern being measured. The ROI should also allow for uncertainty in the location of the target after using pattern recognition. Typically this will make the ROI about 1, 2, 3, 4, or 5 microns wider than the design size of the target. FIGS 1A, 1B, 1C, and 1D show a 2 micron cross-in-frame target. The cross-in-frame design maximizes spacing within the target. Of course, other target shapes and sizes may be used. Targets with an outer dimension of 1 micron may also be used. The ROI around the target is shown in FIG. 7.

The following description relates to X-axis or first axis measurement. Y-axis or second axis measurement is performed in the same way, exchanging "X" for "Y".

II. The image of the target on the detection device in the measuring system or tool changes in the direction perpendicular to measurement. This image is divided into a series of scan lines (y), each running along the direction of measurement, as shown in FIG. 7. The number of scan lines will normally be equal to the number of camera lines in the direction perpendicular to the direction of measurement within the ROI. Although the detection device is typically a two-dimensional camera, e.g., a CCD camera, other detection devices may also be used, for example, a single photo detector used with raster scanning laser light.

III. In each scan line, designated by (y), an initial candidate center point designated by (s) is selected. The light intensity of the image across the scan line (y) is measured. The measured light intensity on one side of the center point (s) is compared to the measured light intensity at a corresponding point on the other side of the center point. A calculation is then performed indicating the degree of symmetry f(s,y) in the image within the ROI about this candidate center point (s). This procedure is then repeated for additional candidate center points on the scan line. For example, a next candidate center point may be selected by adding a positive or negative incremental value to the initial candidate center point. The candidate center point resulting in the minimum value for f(s,y) is taken as the actual center point, or the center of symmetry. The minimum value of f(s,y) is the point on the scan line having highest degree of symmetry, i.e., where the measured light intensity profile along one side of the point (s) is most similar or symmetric to the measured light intensity profile along the other side of the point (s).

Calculating symmetry can be performed in several ways. One way of performing it is from the sum of the square of the difference in intensity at all points the same distance either side of the point, via equation 1 below:

$$f(s, y) = \sqrt{\int_{-ROI}^{+ROI} (I(s+X, y) - I(s-X, y))^2 \, dX} \quad \text{Equation 1}$$

where I(x,y) is the image intensity, (s) is the center point, and the symmetry value at a point s is f(s,y).

Figure 10:
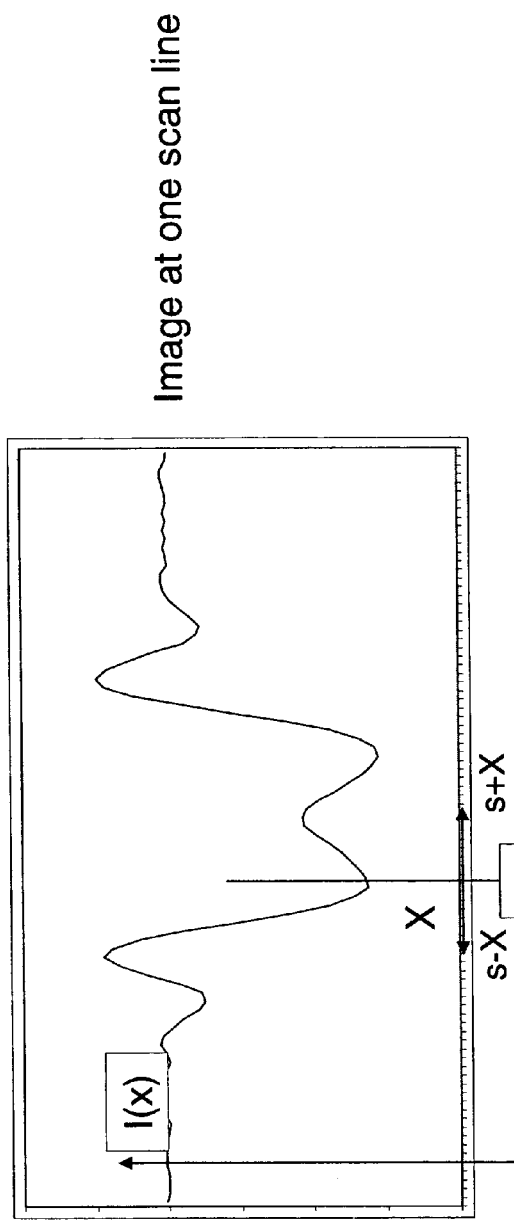
FIG. 10 is a diagram showing selection of a candidate center point and performing a calculation indicating the degree of symmetry in the image within the region of interest about the selected center point.

This equation 1 is shown along with an image at one scan line (y) in FIG. 10.

Figure 11:
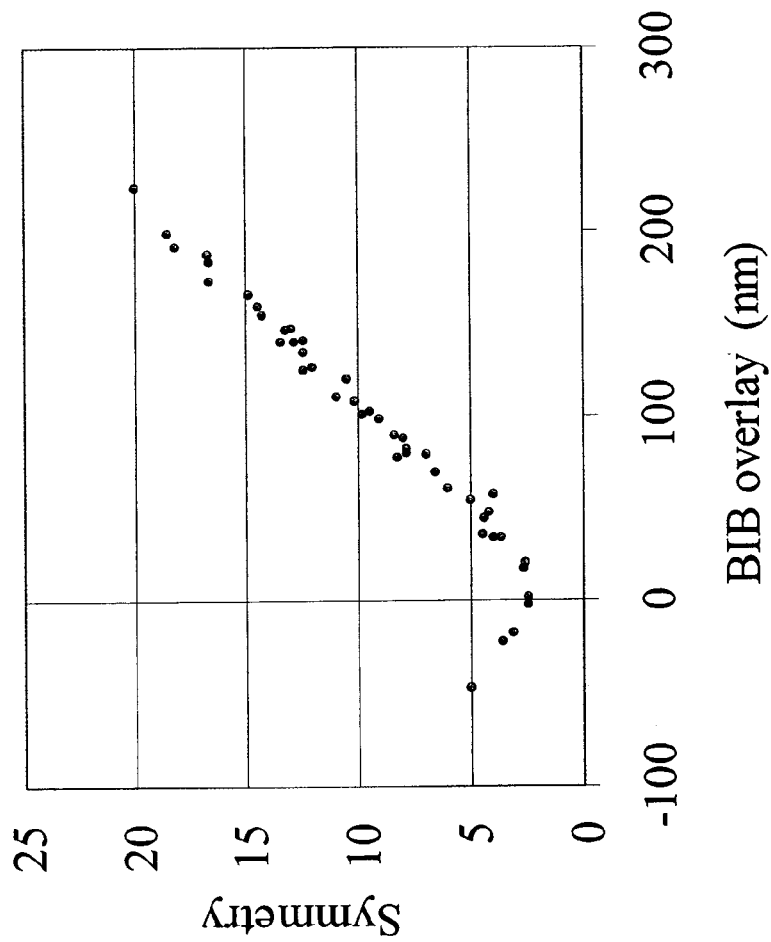
FIG. 11 is a graph of measured symmetry vs. overlay offset.

In FIGS. 8 and 11, the f(s,y) curves for each scan line (y) are shown as the lighter lines. The maximum of these curves (labeled as fmax (y) is related to how much information they contain. The ROI extends beyond the frame of the target, as shown in FIG. 7. Consequently, as shown in FIGS. 8 and 9, the ends of some or all of the scan lines may not go through the target, and do not contribute to any calculation or measurement.

IV. The overlay result is proportional to the minimum value of f (s,yc) for the scan line (yc) along the center of the target, center referring to the direction perpendicular to the measurement direction. Call the minimum f(s,y) value fmin(y), and the value of fmin(yc) is fmin.

Figure 4:
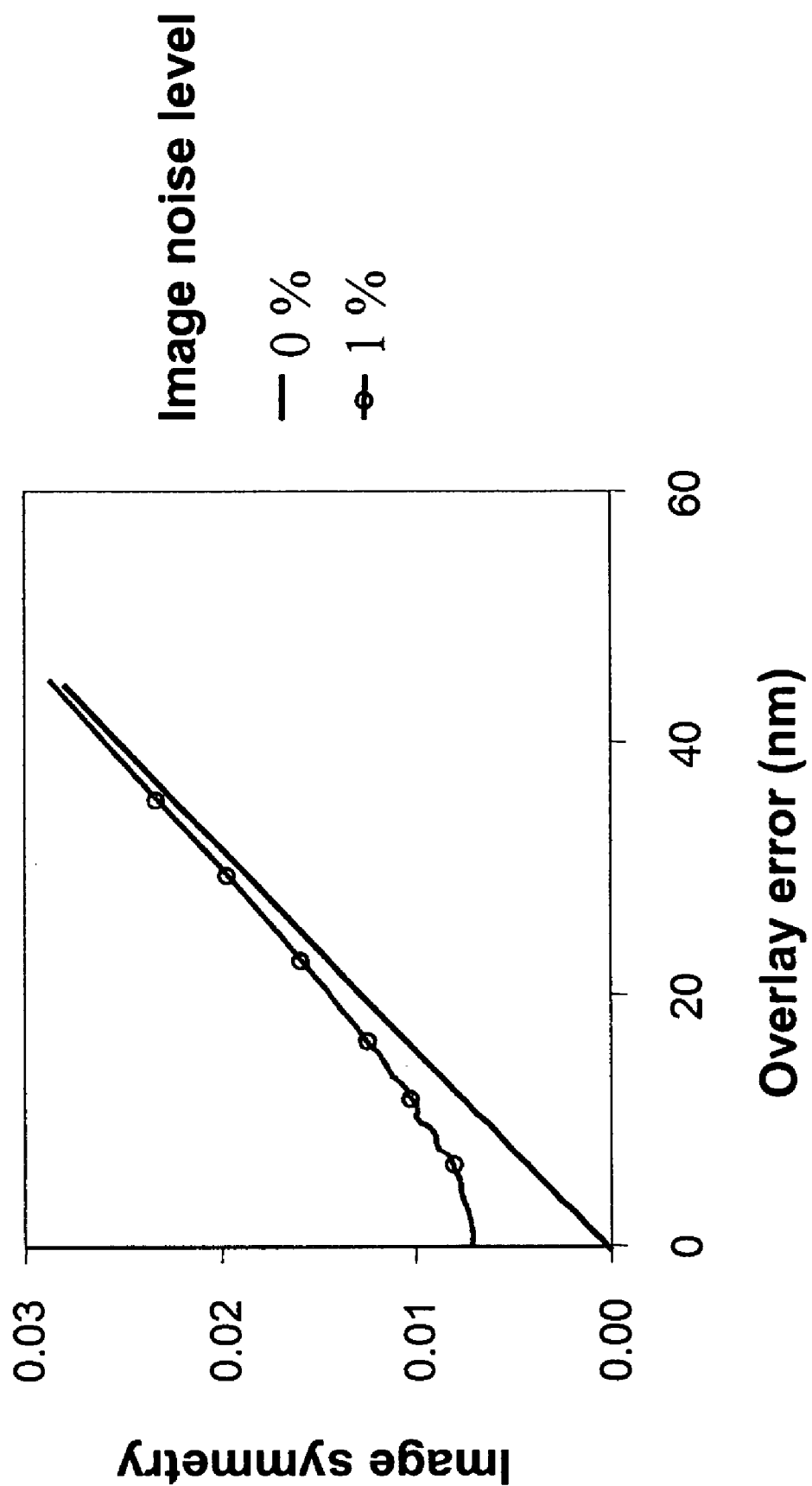
FIG. 4 is a graph of modeled symmetry vs. overlay offset and the effect of image noise.
Figure 5:
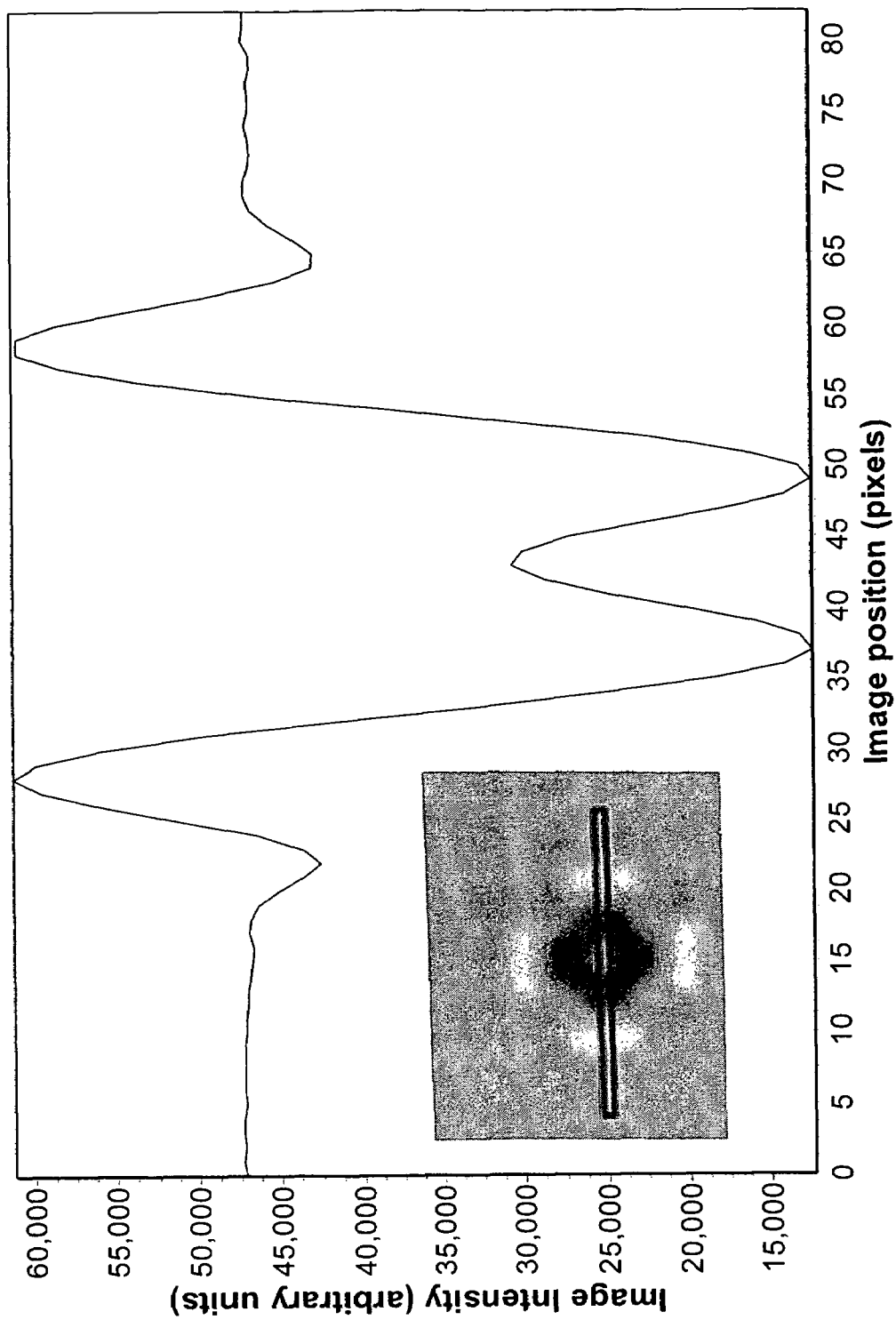
FIG. 5 is graph of the image profile (light intensity vs. position) of the slice through the target shown in the inset of FIG. 5. The inset in FIG. 5 shows a plan view with a slice through the center of the target shown in FIG. 1C, with minimal overlay error.
Figure 6:
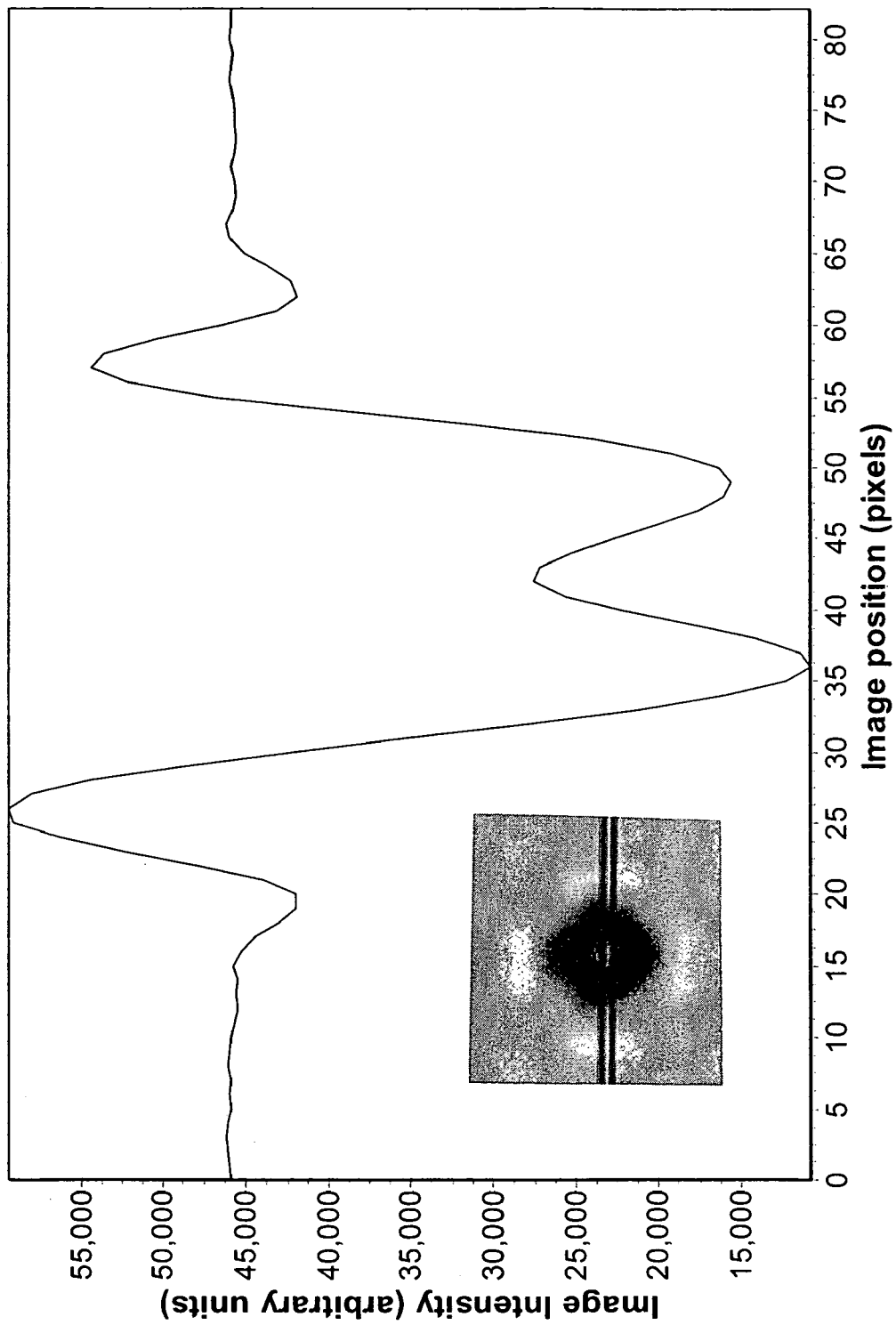
FIG. 6 is a graph of the image profile (light intensity vs. position) of the target shown in the inset in FIG. 6, showing the change in symmetry with a change in overlay offset. The inset in FIG. 6 is a photomicrograph of the target of FIG. 1C, this time with a large overlay error in the X-axis.

FIG. 4 is a theoretical graph showing that over useful ranges, overlay offset and modeled symmetry are linear or nearly linear, and have a defined relationship. The experimental data plotted in FIG. 11 of target symmetry and measured overlay shows the predicted relationship between them. In FIG. 11, the X-axis data result from conventional overlay offset measurements using a box-in-box target, while the Y-axis data result from using the target shown in FIG. 1. This data supports the theoretical graph in FIG. 4. In FIG. 4, the lower trace shows modeled symmetry with no noise. As shown, with no noise, the model predicts a straight line correspondence or relation between asymmetry and overlay error. The upper trace shows modeled symmetry with 1% noise (i.e., random variation in the signal equal to about 1% of the maximum signal level).

After a symmetry value for substantially each scan line is determined, they may be combined in one of several different ways, to derive a combined single symmetry value, which is used to calculate target overlay error. The symmetry values for the scan lines may be averaged or combined in other ways. As described below, one way of combining these values is via a weighted average. Another approach, instead of combining the symmetry values, is to select a minimum symmetry value from among all of the symmetry values, for use in determining overlay error.

Whichever method is used, the resulting single symmetry value is then used to determine target overlay error. The resulting single symmetry value may be used to find overlay error using a theoretical model, for example, as shown in FIG. 4. If the target is provided with built in initial overlay error of for example 20-80, 30-70, 40-60 or about 50 nm, the measurements will consistently be located on the linear section of the graph. Thus, more accurate results may be achieved even in the presence of noise.

Another equivalent way to find overlay error is by using an experimental model, for example as shown in FIG. 11.

The additional steps described below are helpful in providing improved precision, although they are not necessarily essential. The method, is a basic form, may be practiced without the following steps.

Measurement precision can be improved by using more than just the central scan line to form the result. The more image data used in the calculation, the better the precision. Since overlay varies along both the X and Y axes, it is not yet known which (y) scan line is at the center of the target in that direction.

V. For each scan line (y), calculate a weighting factor w(y) that is a maximum where the best information is expected to be, which may be away from the central scan line. In the method described here, this weighting factor is the maximum value of $f(s,y)=fmax(y)$.

VI. Use the weighting factor to calculate a refined estimate for fmin:

$$f(s) = \frac{\int_{-ROI}^{ROI} f_{max}(y) f(s, y) \, dy}{\int_{-ROI}^{ROI} f_{max}(y) \, dy}$$

where f(s) is the weighted average of f(s,y), ROI is the region of interest, $f_{max}(y)$ is used as the weighting function, and the minimum of f(s) is proportional to the overlay error.

These steps are performed because the center of the target (xc,yc) is not yet known. If it were known, an asymmetry could be calculated using:

$$f(s,y)=(I(xc+s,y)-I(xc-s,y))$$

where I(x,y) is the image intensity. The previous definition (from page 8) of f(s,y) is signed, whereas more advantageously this new definition is unsigned. The use of an unsigned calculation for f(s,y) using the square of the differences in intensity avoids the need to find (xc,yc).

VII. Overlay is measured using fmin, which is proportional to signal intensity I. Consequently, measurement precision is improved if the result is normalized by the intensity so as to remove dependency on it. Overlay (e.g., misalignment of overlying targets on different layers) is calculated from f'min:

$$f'min=fmin/sum \text{ over} x sum \text{ over} y \, I(x,y)$$

the sum being performed for all points within the ROI.

VIII. If an unsigned symmetry function is used, then it never approaches zero if there is noise in the signal. This is shown in the upper or top trace in FIG. 4, which intersects the image symmetry axis between 0.00 and 0.01. In this case of an unsigned f(s,y), sensitivity is reduced or lost near zero overlay (where the upper and lower traces in FIG. 4 diverge). This result is easily overcome using a deliberate offset in the pattern. For example, a 100 nm offset is programmed in, then all measurements can take place on the linear portion of symmetry vs. overlay offset curve shown in FIG. 4.

Figure 3:
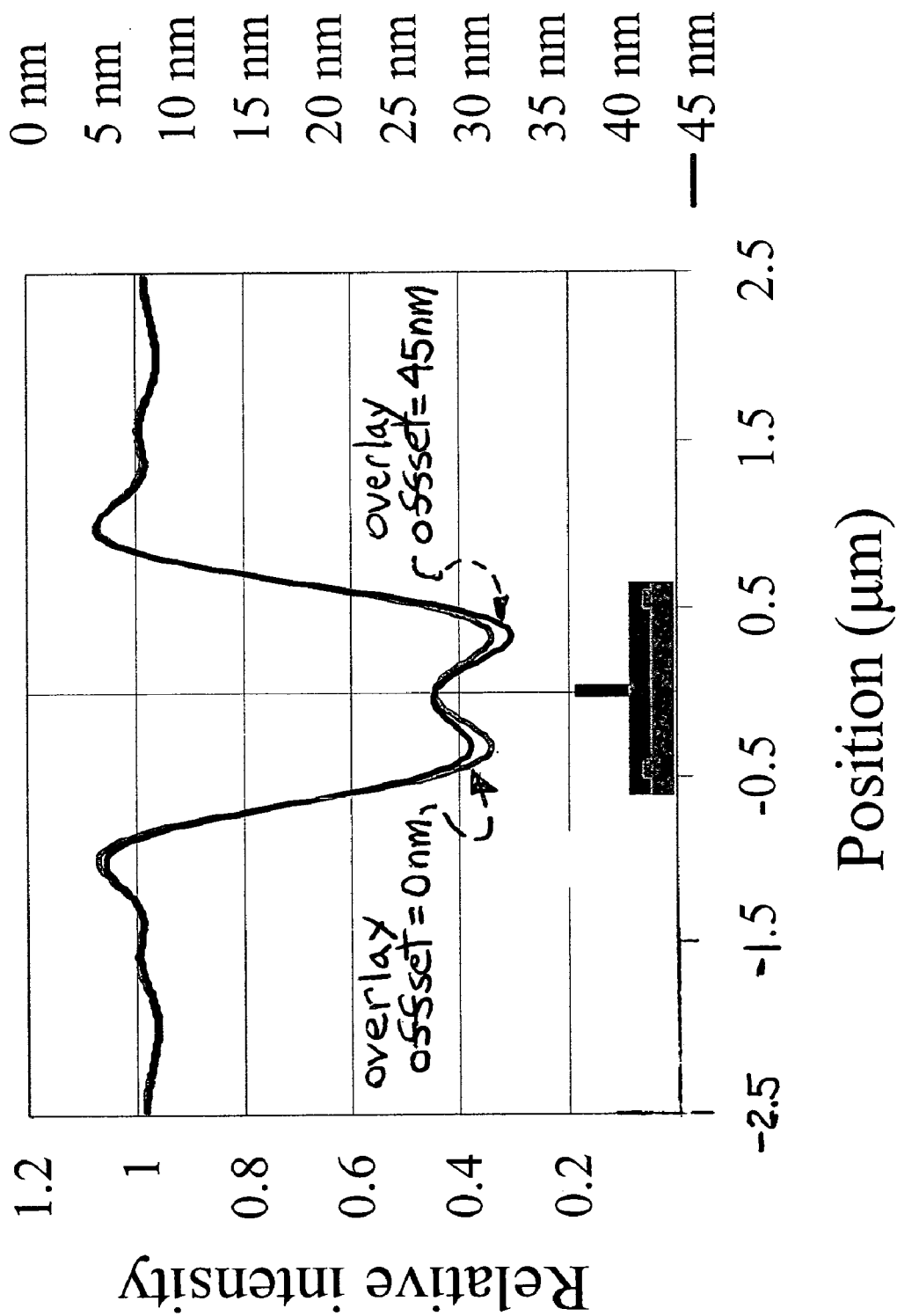
FIG. 3 is a graph of model simulations of relative light intensity measurements vs. position on either side of a target line (a one dimensional target) demonstrating asymmetry in the measurements.

Referring to FIGS. 3 and 4, the image dimensions do not change with overlay. Similarly, image symmetry changes with overlay. Symmetry tracks overlay if there is no noise in the signal. Image noise limits the lowest offset that can be detected.

The model shown in FIG. 3 was calculated for a 1D target. The symmetry calculation for a 2D target, while more complicated, will be readily apparent from the description above. With a 2D target, there is less opportunity to use averaging to reduce effective noise.

A system for performing the measurements as described above may include a digital camera for capturing the target image. The digital camera is typically provided with optical magnification lenses (e.g., a microscope) and linked to a computer programmed to perform the steps described above. The system may also include a light source to illuminate the target, a stage to support the substrate, and robotics or actuators to move the stage, to move targets into alignment, typically under the lens. The digital camera, if used, acquires the target image, in the form of pixels. In the example shown, one pixel corresponds to about 104 nm. Interpolation may be used to resolve the position (s) to subdivide pixels. This allows for calculations of symmetry values about a point located between pixels.

Reference to overlay here means overlay error or overlay offset, e.g., the difference in position or misalignment of a target on one layer with another underlying target on another layer. Reference here to a step performed on each or substantially each scan line, or other parameter, means that one or more scan lines or other parameters may be skipped, within the scope of the invention. Reference here to a minimum value also includes a maximum value, and vice versa, since various equivalent calculations may be used interchanging maximums and minimums. The terms maximum and minimum here also include near maximum and minimum values, as benefits of the invention may be obtained even when practiced in a less effective form. The systems and methods described are useful in manufacturing a wide array of micro-scale devices formed in layers. These include microelectronic semiconductor devices, and also micro-mechanical, micro-electromechanical, and micro-optical devices, thin film devices, memory devices, etc. Various changes, substitutions and modifications can of course be made without departing from the spirit and scope of the invention. The invention, therefore should not be limited only to the specific examples and descriptions provided above. Rather, the invention includes the full range of equivalents of the elements and steps described and shown.

The invention claimed is:

1. A method for measuring overlay error, comprising:
A] placing a first target component on a first layer of a substrate;
B] placing a second target component on a second layer of a substrate, with the first target component and the second target component forming a target;
C] acquiring an image of the target;
D] measuring light intensity along a first scan line of the image;
E] calculating a first symmetry value of the first scan line based on the measured light intensity along the first scan line;
F] measuring light intensity along a subsequent scan line of the image;
G] calculating a subsequent symmetry value of the subsequent scan line of the image based on the measured light intensity along the subsequent scan line;
H] repeating steps F and G to obtain a symmetry value for substantially all scan lines of the image; and I] calculating offset between the first and second target components using the minimum or maximum symmetry value from the symmetry values determined in steps D-H.

2. The method of claim 1 wherein the image of the target is acquired using a camera, and further including dividing the target into an array of pixels, with a scan line running trough substantially each pixel positioned on a single straight line.

3. The method of claim 1 further comprising determining the minimum symmetry value along the center of the target, in a direction perpendicular to the measurement direction, and then determining offset based on this value.

4. The method of claim 1 further comprising:
for substantially each scan line, calculate a weighting factor W;
multiplying the symmetry values of substantially each scan line by the weighting factor W to create a weighted average of symmetry for substantially all of the scan lines combined;
finding the minimum value of the weighted average of scan line symmetry; and
determining the center of the target based on the minimum value of the weighted average.

5. The method of claim 1 further comprising normalizing the symmetry values by light intensity.

6. The method of claim 1 wherein the symmetry values are calculated by the sum of the square of the difference in intensity at all points the same distance on either side of the center point.

7. The method of claim 1 further including providing a known amount of built in offset in the target, and then calculating overlay offset from measured symmetry using a linear function.

8. The method of claim 1 further comprising, for substantially each scan line:
[i] selecting a first candidate center point, measuring light intensity on both sides of the first candidate center point, and then calculating a first symmetry value for the first candidate center point, and [ii] selecting a subsequent candidate center point, measuring light intensity on both sides of the subsequent candidate center point, and then calculating a subsequent symmetry value for the subsequent candidate center point;
[iii] repeating step [ii] to find a center of symmetry by identifying a candidate center point having a symmetry value representing the greatest degree of symmetry among all of the candidate center points; and
[iv] calculating the offset based on the center of symmetry.

9. A method for measuring overlay error in two dimensions, comprising:
A] placing a first target component on a first layer of a substrate;
B] placing a second target component on a second layer of a substrate, with the first target component and the second target component forming a target;
C] selecting a region of interest around the target;
D] acquiring an image of the region of interest;
E] determining offset of the first layer from the second layer along a first (x) axis by:
[i] measuring light intensity along a first series of scan lines (y) extending across the region of interest, with the scan lines (y) generally perpendicular to the first axis;
[ii] calculating a degree of symmetry for substantially each of the scan lines (y) based on the measured light intensity;
[iii] calculating an offset value for the first (x) axis based on a symmetry value calculated in step E [ii];
F] determining offset along a second (y) axis by:
[i] measuring light intensity along a second series of scan lines (x) extending substantially across the region of interest and oriented substantially perpendicular to the second axis;
[ii] calculating a degree of symmetry for substantially each of the scan lines (x);
[iii] calculating an y-axis offset value based on s symmetry value calculated in step F [ii].

10. A method for measuring overlay error, comprising:
A] selecting an initial candidate center point of a first scan line on a target;
B] measuring light intensity on the scan line;
C] comparing measured light intensity on one side of the initial candidate center point to the measured light intensity on the other side of the initial candidate center point;
D] calculating an initial first symmetry value of the first scan line based on the measured light intensity along the first scan line;
E] selecting another candidate center point on the first scan line;
F] calculating a symmetry value for the candidate center point selected in step [e];
G] finding a center of symmetry point by repeating steps [e] and [f] and determining the candidate center point having a minimum symmetry value;
H] repeating steps [a]-[g] for additional scan lines on the target;
I] calculating a symmetry value for substantially each of the center of symmetry points; and
J] determining the minimum symmetry value from step [i] and then calculating a target offset based on the minimum symmetry value.

11. A measurement system, comprising:
imaging means for acquiring an image of a target;
light measuring means for measuring light reflected from the target;
symmetry calculation means for calculating a symmetry value based on measured light; and
offset calculation means for calculating an offset based on at least one symmetry value.

12. The system of claim 11 wherein the imaging means comprises a camera.

13. The system of claim 11 wherein the symmetry calculation means and the offset calculation means comprise a computer programmed to:
A] select an initial candidate center point of a first scan line on a target;
B] measure light intensity on the scan line;
C] compare measured light intensity on one side of the initial candidate center point to the measured light intensity on the other side of the initial candidate center point;
D] calculate an initial first symmetry value of the first scan line based on the measured light intensity along the first scan line;
E] select another candidate center point on the first scan line;
F] calculate a symmetry value for the candidate center point selected in step [e];
G] find a center of symmetry point by repeating steps [e] and [t] and determining the candidate center point having a minimum symmetry value;
H] repeat steps [a]-[g] for additional scan lines on the target; and I] calculate a symmetry value for substantially each of the center of symmetry points; and J] wherein the offset calculation means comprises the computer programmed to determine the minimum symmetry value from step [i] and then calculate a target offset based on the minimum symmetry value.

14. The system of claim 11 wherein the target has a first target component on a first layer and an overlying second target component on a second layer and wherein the offset is the offset between the first target component and the second target component.

* * * * *

UNITED STATES PATENT AND TRADEMARK OFFICE
CERTIFICATE OF CORRECTION

PATENT NO. : 7,477,396 B2
APPLICATION NO. : 11/360031
DATED : January 13, 2009
INVENTOR(S) : Nigel P. Smith et al.

It is certified that error appears in the above-identified patent and that said Letters Patent is hereby corrected as shown below:

On the title page, item "(73) Assignee:"

After Nanometrics Incorporated, please add
--Industrial Research Technology Institute, Taipai (TW)--.

Signed and Sealed this

Twenty-third Day of June, 2009

JOHN DOLL
*Acting Director of the United States Patent and Trademark Office*